United States Patent
Mai et al.

(10) Patent No.: US 9,645,595 B2
(45) Date of Patent: May 9, 2017

(54) METHOD FOR MEASURING FREQUENCY OF PHASOR OF POWER SYSTEM

(71) Applicant: GUANGDONG EAST POWER CO., LTD., Dongguan, Guangdong (CN)

(72) Inventors: Ruikun Mai, Guangdong (CN); Ling Fu, Guangdong (CN); Haibo Xu, Guangdong (CN); Simo He, Guangdong (CN)

(73) Assignee: GUANGDONG EAST POWER CO., LTD., Dongguan (CN)

( * ) Notice: Subject to any disclaimer, the term of this patent is extended or adjusted under 35 U.S.C. 154(b) by 411 days.

(21) Appl. No.: 14/364,787

(22) PCT Filed: Sep. 27, 2012

(86) PCT No.: PCT/CN2012/082215
§ 371 (c)(1),
(2) Date: Jun. 12, 2014

(87) PCT Pub. No.: WO2013/086887
PCT Pub. Date: Jun. 20, 2013

(65) Prior Publication Data
US 2014/0330443 A1 Nov. 6, 2014

(30) Foreign Application Priority Data
Dec. 14, 2011 (CN) .......................... 2011 1 0416897

(51) Int. Cl.
*G06F 19/00* (2011.01)
*G05F 1/66* (2006.01)
(Continued)

(52) U.S. Cl.
CPC .......... *G05F 1/66* (2013.01); *G01R 19/2513* (2013.01); *G01R 23/16* (2013.01); *Y02E 60/728* (2013.01); *Y04S 10/265* (2013.01)

(58) Field of Classification Search
CPC . Y02E 60/728; Y02E 60/7807; Y04S 10/265; Y04S 20/32; Y04S 20/327;
(Continued)

(56) References Cited

U.S. PATENT DOCUMENTS 6,459,998 B1 * 10/2002 Hoffman .............. H02H 1/0076
340/661
2008/0122293 A1 * 5/2008 Ohm ....................... H02J 3/383
307/86

(Continued)

OTHER PUBLICATIONS

Mai et al., "A Dynamic Sycnhrophasor Estimation Algorithm for Online Application," IEEE, Apr. 2010.*

*Primary Examiner* — Darrin Dunn
(74) *Attorney, Agent, or Firm* — Ming Chow; Sinorica, LLC

(57) ABSTRACT

The present invention relates to a method for measuring the frequency of phasor of a power system, belonging to the technical field of power systems and automation thereof. A grid-connected photovoltaic generation system is provided with a control module, a data buffer module, an inverter, a sampling module and an analog-to-digital conversion module; a voltage transformer is connected to the grid side of the grid-connected photovoltaic generation system; the voltage transformer is electrically connected to the analog-to-digital conversion module; the analog-to-digital conversion module converts an analog signal sent by the voltage transformer into a digital signal; the sampling module samples the digital signal and transmits the digital signal into the data buffer module; the data buffer module is provided with a plurality of data windows; and the control module receives signals from the data windows.

5 Claims, 3 Drawing Sheets

(51) Int. Cl.
*G01R 19/25* (2006.01)
*G01R 23/16* (2006.01)

(58) Field of Classification Search
CPC .. G01R 19/2513; G01R 21/133; G01R 25/00; G01R 29/18; G01R 15/142; G01R 23/16; G01R 19/00; G01R 19/0007; G01R 19/02
See application file for complete search history.

(56) References Cited

U.S. PATENT DOCUMENTS

| | | | | |
|---|---|---|---|---|
| 2008/0278983 A1* | 11/2008 | Park | | H02J 7/35 363/95 |
| 2011/0282514 A1* | 11/2011 | Ropp | | H02J 3/383 700/297 |
| 2011/0292705 A1* | 12/2011 | Fornage | | H02J 3/383 363/131 |
| 2012/0049637 A1* | 3/2012 | Teichmann | | H02J 3/26 307/82 |
| 2012/0056587 A1* | 3/2012 | Iida | | H01M 10/441 320/118 |
| 2012/0091901 A1* | 4/2012 | Tanigawa | | F21S 9/03 315/158 |
| 2012/0127764 A1* | 5/2012 | Phadke | | H02J 3/383 363/37 |
| 2012/0173031 A1* | 7/2012 | Parameswaran | | H02J 7/35 700/295 |
| 2012/0212064 A1* | 8/2012 | Spanoche | | H02M 7/48 307/82 |
| 2012/0253541 A1* | 10/2012 | Arditi | | H02J 1/102 700/298 |
| 2012/0255591 A1* | 10/2012 | Arditi | | H01L 31/02021 136/244 |

* cited by examiner

METHOD FOR MEASURING FREQUENCY OF PHASOR OF POWER SYSTEM

FIELD OF THE INVENTION

The present invention relates to the technical field of power systems and automation thereof, in particular to a method for measuring the frequency of phasor of a power system.

BACKGROUND OF THE INVENTION

In a grid-connected photovoltaic generation system, the frequency of phasor is an important observation. The automatic safety device of the grid-connected photovoltaic generation system needs to measure the value of the frequency of phasor in real time, and takes corresponding control measures according to the change of the value. For the automatic safety device of the generation system, the common frequency measurement methods include hardware zero-crossing detection method and a method of calculating a phase upon discrete Fourier transform and further calculating the frequency. Both the two methods have some disadvantages. In the hardware zero-crossing detection method, the precision is likely to be interfered by the slight fluctuation of the reference level of a power supply; however, as lots of power electronic apparatuses are used in the grid-connected photovoltaic generation system, lots of noise and harmonic waves will be generated, as a result, the hardware zero-crossing detection cannot be implemented correctly. In the method of calculating a phase upon discrete Fourier transform and further calculating the frequency, the key point is that the phase must be calculated accurately. If the phase is calculated inaccurately, the accuracy of calculation of the frequency will be influenced.

As shown in FIG. 3, in a conventional method for calculating a phase by discrete Fourier transform, it is required to divide singles connected by a sampling module into a plurality of data windows, and the frequency, magnitude and other related parameters of signals in different data windows are assumed to be constant. Therefore, the conventional method for calculating a phase by discrete Fourier transform is to transform signals in two different data windows and further output results. However, as the grid-connected photovoltaic generation system is a dynamically nonlinear system, the frequency and amplitude of signals in the data windows change from moment to moment in the generation system. In this case, the accuracy of measurement by the conventional method for calculating a phase upon discrete Fourier transform will decline. As a result, the output frequency and phasor of an inventor in the grid-connected photovoltaic generation system are asynchronous with the actual frequency and phasor of the generation system, or even unexpected oscillation will occur in the grid-connected photovoltaic generation system.

SUMMARY OF THE INVENTION

In view of the deficiencies of the above background art, the present invention provides a method for measuring the frequency of phasor of a power system. This method is free from the interference of the reference level and is flexible, avoids the phenomenon of information leakage caused by asynchronous sampling, and effectively eliminates or weakens the oscillation effect caused by dynamic characteristics.

To achieve the above object, the present invention discloses a method for measuring the frequency of phasor of a power system, including the following steps:

(1) a grid-connected photovoltaic generation system is provided with a control module, a data buffer module, an inverter, a sampling module and an analog-to-digital conversion module, a voltage transformer being connected to the grid side of the grid-connected photovoltaic generation system, the voltage transformer being electrically connected to the analog-to-digital conversion module, the analog-to-digital conversion module converting an analog signal sent by the voltage transformer into a digital signal, the sampling module sampling the digital signal and transmitting the digital signal into the data buffer module, the data buffer module being provided with a plurality of data windows, the control module receiving signals from the data windows;

(2) the control module performs Fourier transform to signals of the data windows in the data buffer module:

$$X(M, l) = \sum_{n=-(N-1)/2}^{(N-1)/2} x_a(n+l)h(n)e^{-j(n+l)\omega_0}$$

$$= \sum_{n=-(N-1)/2}^{(N-1)/2} \left[ \sum_{k=0}^{K} \frac{1}{k!} a^{(k)} (\tau_{n+l})^k \right] \cdot$$

$$e^{j(n+l)\omega_0} \cdot h(n) \cdot e^{-j(n+l)\omega_0} +$$

$$\sum_{n=-(N-1)/2}^{(N-1)/2} \left[ \sum_{k=0}^{K} \frac{1}{k!} a^{(k)} (\tau_{n+l})^k \right]^* \cdot$$

$$e^{-j(n+l)\omega_0} \cdot h(n) \cdot e^{-j(n+l)\omega_0}$$

$$\sum_{k=0}^{K} \left[ a^{(k)} \cdot \frac{1}{k!} \sum_{n=-(N-1)/2}^{(N-1)/2} (\tau_{n+l})^k \cdot h(n) \right] +$$

$$\sum_{k=0}^{K} \left\{ [a^{(k)}]^* \cdot \frac{1}{k!} \sum_{n=-(N-1)/2}^{(N-1)/2} (\tau_{n+l})^k \cdot h(n) \cdot e^{-j2(n+l)\omega_0} \right\}$$

$$= \sum_{k=0}^{K} [a^{(k)} \cdot H(k, l, 0)] + \sum_{k=0}^{K} \{[a^{(k)}]^* \cdot H(k, l, -2\omega_0)\}$$

$$= D_{k,l} \cdot A + C_{K,l} \cdot A^*,$$

where, X(M,l) is a transformed value of the measured result of phasor, M refers to phasor reference points in the data windows (21), l is a point distance from each sampling point to the reference point in the data windows, N is the time span of the data windows, h(n) is a window function of the data windows, $\omega_0$ is the time coefficient of the window function of the data windows, $x_a(n+l)$ is the value of the (n+1)th sampling point in the data windows, $a^{(k)}$ is the kth order derivative of the signals of the data windows at t=0, the coefficient of the kth order derivative $a^{(k)}$ is $$H(k, l, \omega) = \frac{1}{k!} \sum_{n=-(N-1)/2}^{(N-1)/2} (\tau_{n+l})^k \cdot h(n) \cdot e^{j(n+l)\omega} \},$$

and, $D_{K,l}$ and $C_{K,l}$ are a coefficient column of the derivative $a^{(k)}$ and a coefficient column matrix of a conjugate transposed derivative $[a^{(k)}]^*$, respectively;

(3) the phasor reference points M are unified into one point, and the transformed value X(M,l) of the measured result of phasor is phase-shifted and calculated to obtain an estimated phasor value $\bar{X}(M,l)$:

$$\bar{X}(M,l) = e^{-jl\omega_0} \cdot \bar{X}(M+l,0).$$

(4) the control module (10) combines the transformed value X(M,l) of the measured result of phasor with the estimated phasor value $\bar{X}(M,l)$ and performs recombination:

$$E \cdot X = D \cdot A + C A^*,$$

where, $e^{-jl\omega_0}$ is a vector corresponding to the sampling point of the data windows; a diagonal matrix E=diag $(e^{-j\omega_0 l_{M-L}}, \ldots, e^{-j\omega_0 l_{M+L}})$ is constructed relative to $e^{-jl\omega_0}$; a diagonal matrix $x=[\bar{X}(M,-L), \ldots, \bar{X}(M,L)]^T$ is obtained from the matrix of $\bar{X}(M,l)$; $D=[(D_{K,l_{M-L}})^T, \ldots, (D_{K,l_{m+L}})^T]^T$; $C=[(C_{K,l_{M-L}})^T, \ldots, (C_{K,l_{M+L}})^T]^T$; $A=[a^{(0)}, \ldots, a^{(K)}]^T$; meanwhile, the corresponding estimated phasor value $\bar{X}(M,l)$ at a phasor reference point M in the data windows is represented by Taylor series, and a modified phasor value X(M) corresponding to the phasor reference point M in the data windows is obtained by the least square method; and (5) the control module performs data processing to the modified phasor value X(M) to obtain a modified frequency value F(M).

Further, the inverter combines the modified phasor value X(M) with the modified frequency value F(M) to output the phasor and frequency of a driving signal.

Further, the control module is electrically connected to a communication unit, the inverter outputting and transmitting the phasor and frequency of the driving signal to a network via the communication unit, the communication unit performing communication over IEEE standard C37.118.

Further, the calculation formula between the modified phasor value X(M) and the modified frequency value F(M) is:

$$F(M) = \frac{\text{angle}[X(M_1) \cdot X(M_2)^*]}{2\pi(T_2 - T_1)},$$

where, $M_1$ and $M_2$ are central sampling points of two different data windows, $T_1$ and $T_2$ refer to time corresponding to $M_1$ and $M_2$, respectively, and angle$[X(M_1) \cdot X(M_2)^*]$ is an included angle between the phasor values $X(M_1)$ and $X(M_2)$.

Further, the sampling module is electrically connected to a GPS receiver, the GPS receiver marking the digital signals collected by the sampling module by an absolute time mark, the data buffer module receiving the signals of the data windows marked by the absolute time mark, the modified phasor value X(M) and the modified frequency value F(M) being synchronous with the absolute time mark of the signals of the data windows.

In conclusion, by using Taylor series to represent the corresponding estimated phasor value X(M,l) at the phasor reference points M in the data windows for re-modification, and obtaining the precise modified phasor value X(M) corresponding to the phasor reference points M in the data windows by the least square method, the method for measuring the frequency of phasor of a power system provided by the present invention makes the automatic safety device of the generation system free from the interference of the reference level and is flexible, avoids the phenomenon of frequency spectrum leakage caused by asynchronous sampling, and effectively eliminates or weakens an oscillation effect caused by dynamic characteristics.

DETAILED DESCRIPTION OF THE PREFERRED EMBODIMENTS

In order to further understand the features, technical means, specific objects and functions of the present invention, the present invention will be further described as below in details with reference to the accompanying drawings by specific embodiments.

Figure 1:
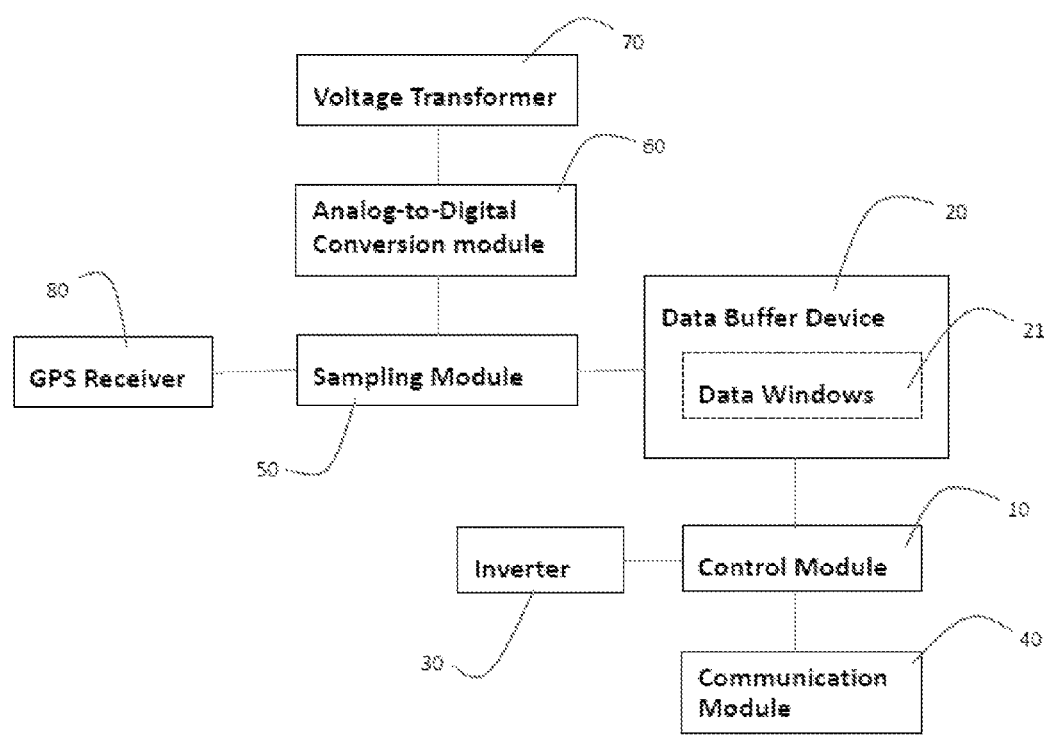
FIG. 1 is a structural diagram of a grid-connected photovoltaic generation system according to the present invention.
Figure 2:
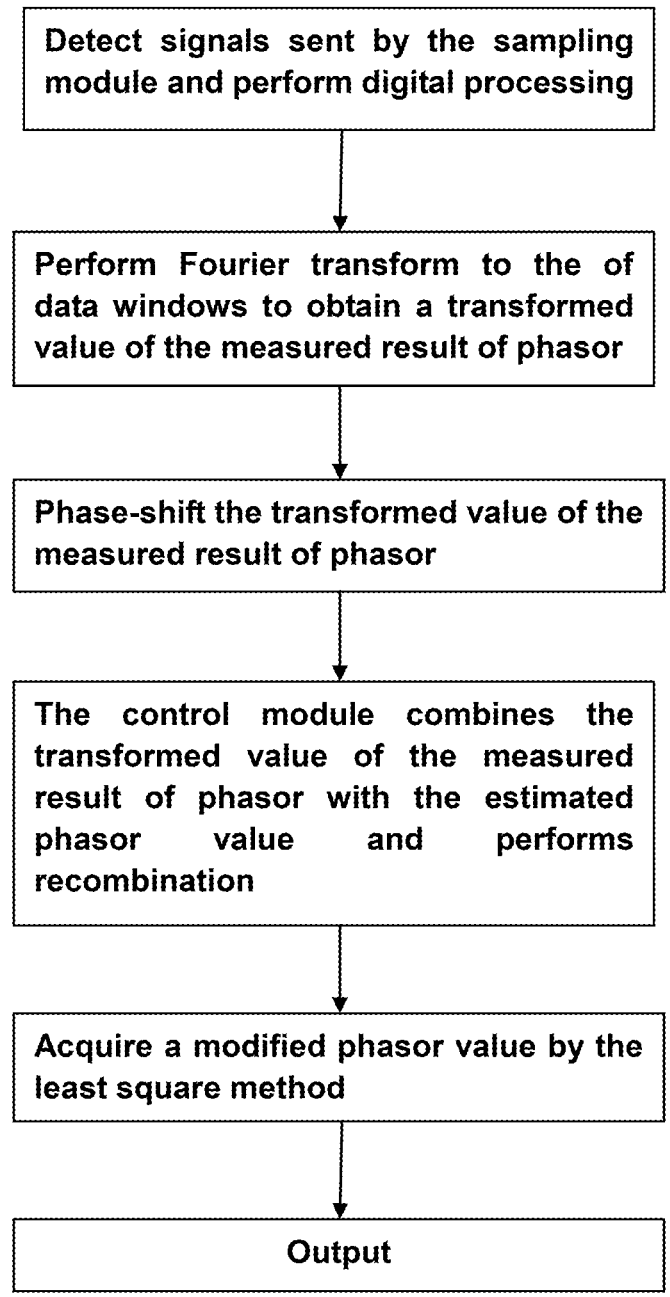
FIG. 2 is a flowchart of a method for measuring the frequency of phasor of a power system according to the present invention.
Figure 3:
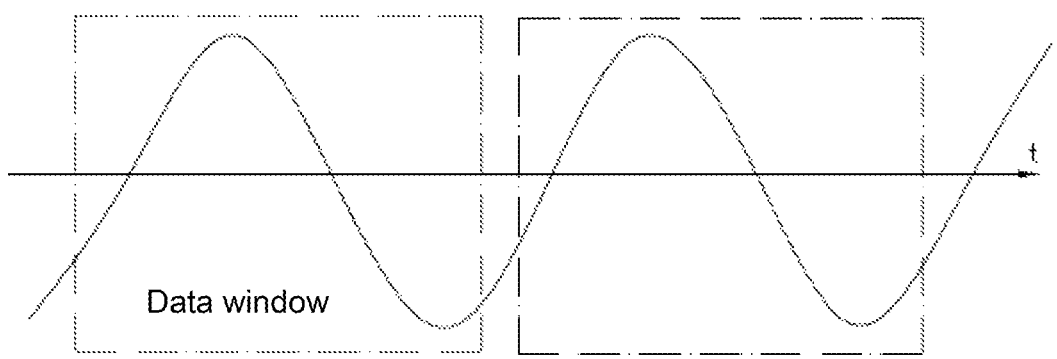
FIG. 3 is a schematic diagram of a data window of a conventional sampling module according to the present invention.

As shown in FIG. 1 and FIG. 2, the present invention provides a method for measuring the frequency of phasor of a power system, implemented through the following steps:

(1) A grid-connected photovoltaic generation system is provided with a control module 10, a data buffer module 20, an inverter 30, a communication unit 40, a sampling module 50 and an analog-to-digital conversion module 60. A voltage transformer 70 is connected to the grid side of the grid-connected photovoltaic generation system in order to reduce the working voltage of the grid side. The voltage transformer 70 is electrically connected to the analog-to-digital conversion module 60. The analog-to-digital conversion module 60 converts an analog signal sent by the voltage transformer 70 into a digital signal. The sampling module 50 is electrically connected to a GPS (Global Positioning System) receiver 80. The sampling module 50 samples the digital signal and transmits the digital signal into the data buffer module 20. The GPS receiver 80 marks the digital signals collected by the sampling module 50 by an absolute time mark. The data buffer module 20 is provided with a plurality of data windows (21). The control module (10) receives the signals marked by the absolute time mark from the data windows (21), and carries out calculation to modify the output phasor and frequency of the inventor 30.

(2) The control module 10 performs Fourier transform to signals of the data windows 21 in the data buffer module 20:

$$\begin{aligned}
X(M, l) &= \sum_{n=-(N-1)/2}^{(N-1)/2} x_a(n+l) h(n) e^{-j(n+l)\omega_0} \\
&= \sum_{n=-(N-1)/2}^{(N-1)/2} \left[ \sum_{k=0}^{K} \frac{1}{k!} a^{(k)} (\tau_{n+l})^k \right] \cdot \\
&\quad e^{j(n+l)\omega_0} \cdot h(n) \cdot e^{-j(n+l)\omega_0} + \\
&\quad \sum_{n=-(N-1)/2}^{(N-1)/2} \left[ \sum_{k=0}^{K} \frac{1}{k!} a^{(k)} (\tau_{n+l})^k \right]^* \cdot \\
&\quad e^{-j(n+l)\omega_0} \cdot h(n) \cdot e^{-j(n+l)\omega_0} \\
&\quad \sum_{k=0}^{K} \left[ a^{(k)} \cdot \frac{1}{k!} \sum_{n=-(N-1)/2}^{(N-1)/2} (\tau_{n+l})^k \cdot h(n) \right] +
\end{aligned}$$

-continued $$\sum_{k=0}^{K}\left\{[a^{(k)}]^* \cdot \frac{1}{k!} \sum_{n=-(N-1)/2}^{(N-1)/2} (\tau_{n+l})^k \cdot h(n) \cdot e^{-j2(n+l)\omega_0}\right\}$$

$$= \sum_{k=0}^{K} [a^{(k)} \cdot H(k, l, 0)] + \sum_{k=0}^{K} \{[a^{(k)}]^* \cdot H(k, l, -2\omega_0)\}$$

$$= D_{K,l} \cdot A + C_{K,l} \cdot A^*,$$

where, $X(M,l)$ is a transformed value of the measured result of phasor, M refers to phasor reference points in the data windows, l is a point distance from each sampling point to the reference point in the data windows, N is the time span of the data windows, $h(n)$ is a window function of the data windows, $\omega_0$ is the time coefficient of the window function of the data windows, $x_a(n+l)$ is the value of the (n+l)th sampling point in the data windows, $a^{(k)}$ is the kth order derivative of the signals of the data windows at t=0, the coefficient of the kth order derivative $a^{(k)}$ is $$H(k, l, \omega) = \frac{1}{k!} \sum_{n=-(N-1)/2}^{(N-1)/2} (\tau_{n+l})^k \cdot h(n) \cdot e^{j(n+l)\omega}\},$$

and, $D_{K,l}$ and $C_{K,l}$ are a coefficient column matrix of the derivative $a^{(k)}$ and a coefficient column matrix of a conjugate transposed derivative $[a^{(k)}]^*$, respectively.

(3) The phasor reference points M are unified into one point, and the transformed value $X(M,l)$ of the measured result of phasor is phase-shifted and calculated to obtain an estimated phasor value $\bar{X}(M,l)$:

$$\bar{X}(M,l) = e^{-jl\omega_0} \cdot \bar{X}(M+l,0)$$

(4) The control module 10 combines the transformed value $X(M,l)$ of the measured result of phasor with the estimated phasor value $\bar{X}(M,l)$ and performs recombination:

$$E \cdot X = D \cdot A + C \cdot A^*$$

where, $e^{-jl\omega_0}$ is a vector corresponding to the sampling point of the data windows; a diagonal matrix $E=\text{diag}(e^{-j\omega_0 l_{M-L}}, \ldots, e^{-j\omega_0 l_{M+L}})$ is constructed relative to $e^{-jl\omega_0}$; a diagonal matrix $X=[\bar{X}(M,-L), \ldots, \bar{X}(M,L)]^T$ is obtained from the matrix of $\bar{X}(M,l)$; $D=[(D_{K,l_{M-L}})^T, \ldots, (D_{K,l_{M+L}})^T]^T$; $C=[(C_{K,l_{M-L}})^T, \ldots, (C_{K,l_{M+L}})^T]^T$; $A=[a^{(0)}, \ldots, a^{(K)}]^T$.

Meanwhile, the corresponding estimated phasor value $\bar{X}(M,l)$ at the phasor reference points M in the data windows is represented by Taylor series, and a modified phasor value $X(M)$ corresponding to the phasor reference point M in the data windows is obtained by the least square method; and (5) The control module 10 performs data processing to the modified phasor value $X(M)$ to obtain a modified frequency value $F(M)$:

$$F(M) = \frac{\text{angle}[X(M_1) \cdot X(M_2)^*]}{2\pi(T_2 - T_1)},$$

where, $M_1$ and $M_2$ are central sampling points of two different data windows 21, $T_1$ and $T_2$ are the time corresponding to $M_1$ and $M_2$, respectively, and angle$[X(M_1) \cdot X(M_2)^*]$ is an included angle between the phasor values $X(M_1)$ and $X(M_2)$.

(6) The modified phasor value $X(M)$ and the modified frequency value $F(M)$ are synchronous with the absolute time mark of the signals of the data windows. The inverter 30 combines the modified phasor value $X(M)$ with the modified frequency value $F(M)$ to output the phasor and frequency of a driving signal, and transmitting the phasor and frequency of the driving signal to a network via the communication unit 40 after marking the absolute time mark. The communication unit 40 performs communication over IEEE standard C37.118.

In conclusion, by using Taylor series to represent the corresponding estimated phasor value $X(M,l)$ at the phasor reference points M in the data) windows for re-modification, and obtaining the precise modified phasor value $X(M)$ corresponding to the phasor reference points M in the data windows by the least square method, the method for measuring the frequency of phasor of a power system provided by the present invention makes the automatic safety device of the generation system free from the interference of the reference level and is flexible, avoids the phenomenon of frequency spectrum leakage caused by asynchronous sampling, and effectively eliminates or weakens an oscillation effect caused by dynamic characteristics.

The foregoing embodiment merely shows one implementation way of the present invention. Although this embodiment has been described specifically and in details, it is not intended to limit the scope of the present invention. It is to be pointed out that, a person of ordinary skill in the art may make various changes and improvements without departing from the idea of the present invention, and these changes and improvements shall fall into the protection scope of the present invention. Therefore, the protection scope shall be subject to the appended claims.

What is claimed is:

1. A method for measuring a frequency of phasor of a power system, comprising the following steps:
    (1) providing a grid-connected photovoltaic generation system with a control module (10), a data buffer module (20), an inverter (30), a sampling module (50) and an analog-to-digital conversion module (60), a voltage transformer (70) being connected to a grid side of the grid-connected photovoltaic generation system, the voltage transformer (70) being electrically connected to the analog-to-digital conversion module (60), the analog-to-digital conversion module (60) converting an analog signal sent by the voltage transformer (70) into a digital signal, the sampling module (50) sampling the digital signal and transmitting the digital signal into the data buffer module (20), the data buffer module (20) being provided with a plurality of data windows (21), the control module (10) receiving signals from the data windows (21);
    (2) the control module (10) performing Fourier transform calculation to the signals of the data windows (21) in the data butter module (20):

$$X(M, l) = \sum_{n=-(N-1)/2}^{(N-1)/2} x_a(n+l)h(n)e^{-j(n+l)\omega_0}$$

-continued $$= \sum_{n=-(N-1)/2}^{(N-1)/2} \left[ \sum_{k=0}^{K} \frac{1}{k!} a^{(k)}(\tau_{n+l})^k \right] \cdot$$
$$e^{j(n+l)\omega_0} \cdot h(n) \cdot e^{-j(n+l)\omega_0} +$$
$$\sum_{n=-(N-1)/2}^{(N-1)/2} \left[ \sum_{k=0}^{K} \frac{1}{k!} a^{(k)}(\tau_{n+l})^k \right]^* \cdot$$
$$e^{-j(n+l)\omega_0} \cdot h(n) \cdot e^{-j(n+l)\omega_0}$$

$$\sum_{k=0}^{K} \left[ a^{(k)} \cdot \frac{1}{k!} \sum_{n=-(N-1)/2}^{(N-1)/2} (\tau_{n+l})^k \cdot h(n) \right] +$$
$$\sum_{k=0}^{K} \left\{ [a^{(k)}]^* \cdot \frac{1}{k!} \sum_{n=-(N-1)/2}^{(N-1)/2} (\tau_{n+l})^k \cdot h(n) \cdot e^{-j2(n+l)\omega_0} \right\}$$

$$= \sum_{k=0}^{K} [a^{(k)} \cdot H(k, l, 0)] + \sum_{k=0}^{K} \{[a^{(k)}]^* \cdot H(k, l, -2\omega_0)\}$$

$$= D_{K,l} \cdot A + C_{K,l} \cdot A^*,$$

wherein, X(M,l) is a transformed value of a measured result of phasor, M is a phasor reference point in the data windows (21), l is a point distance from each sampling point to the reference point, N is a time span of the data windows (21), h(n) is a window function of the data windows (21), $\omega_0$ is a time factor of the window function of the data windows (21), $x_a$(n+l) is a value of a n+1$^{th}$ sampling point in the data windows (21), $a^{(k)}$ is a k$^{th}$ derivative when the signals of the data windows (21) are at t=0, a factor of the k$^{th}$ derivative $a^{(k)}$ is $$H(k, l, \omega) = \frac{1}{k!} \sum_{n=-(N-1)/2}^{(N-1)/2} (\tau_{n+l})^k \cdot h(n) \cdot e^{j(n+l)\omega},$$

and, $D_{K,l}$ and $C_{K,l}$ are a column of the factor of the derivative $a^{(k)}$ and a column matrix a factor of a conjugate transpose derivative $[a^{(k)}]^*$, respectively;

(3) the phasor reference point M being unified into one point, and the transformed value X(M,l) of the measured result of phasor being phase-shifted and calculated to obtain a phasor estimated value $\hat{X}(M,l)$:

$\hat{X}(M,l) = e^{-jl\omega_0} \cdot \hat{X}(M+l,0);$ (4) the control module (10) combining the transformed value X(M,l) of the measured result of phasor with the phasor estimated value $\hat{X}(M,l)$ and performs recombination:

$E \cdot X = D \cdot A + C \cdot A^*,$ wherein, $e^{-jl\omega_0}$ is a vector corresponding to the sampling point of the data windows (21), a diagonal matrix $E=\text{diag}(e^{-j\omega_0 l_{M-L}}, \ldots, e^{-j\omega_0 l_{M+L}})$ is constructed relative to $e^{-jl\omega_0}$; a diagonal matrix $X=[\hat{X}(M,-L), \ldots, \hat{X}(M,L)]^T$ is constructed relative to the matrix of $\hat{X}(M,l)$; $D=[(D_{K,l_{M-L}})^T, \ldots, (D_{K,l_{m+L}})^T]^T$; $C=[(C_{K,l_{M-L}})^T, \ldots, (C_{K,l_{M+L}})^T]^T$; $A=[a^{(0)}, \ldots, a^{(K)}]^T$; meanwhile, the corresponding phasor estimated value $\hat{X}(M,l)$ at the phasor reference point M in the data windows (21) is represented by Taylor's series, and a modified phasor value X(M) corresponding to the phasor reference point M in the data windows (21) is obtained by a least square method; and (5) the control module (10) performing data processing to the modified phasor value X(M) to obtain a modified frequency value F(M).

2. The method for measuring the frequency of phasor of a power system according to claim 1, wherein the inverter (30) combines the modified phasor value X(M) with the modified frequency value F(M) to output the phasor and frequency of a drive signal.

3. The method for measuring the frequency of phasor of a power system according to claim 2, wherein the control module (10) is electrically connected to a communication unit (40), the inverter (30) outputting and transmitting the phasor and frequency of the drive signal to a network via the communication unit (40), the communication unit (40) performing communication through IEEE standard C37.118.

4. The method for measuring the frequency of phasor of a power system according to claim 1, wherein the calculation formula between the modified phasor value X(M) and the modified frequency value is F(M) is:

$$F(M) = \frac{\text{angle}[X(M_1) \cdot X(M_2)^*]}{2\pi(T_2 - T_1)},$$

wherein, $M_1$ and $M_2$ are window center sampling points of two different data windows 21, $T_1$ and $T_2$ are times corresponding to $M_1$ and $M_2$, respectively, and angle $[X(M_i) \cdot X(M_2)^*]$ is an included angle between the phasor values $X(M_1)$ and $X(M_2)$.

5. The method for measuring the frequency of phasor of a power system according to claim 1, wherein the sampling module (50) is electrically connected to a GPS receiver (80), the GPS receiver (80) marking the digital signals collected by the sampling module by an absolute time mark (50), the data buffer module (20) receiving the signals of the data windows (21) marked by the absolute time mark, the modified phasor value X(M) and the modified frequency value F(M) being synchronous with the absolute time mark of the signals of the data windows (21).

* * * * *